US010121907B2

(12) United States Patent
Bhalla et al.

(10) Patent No.: US 10,121,907 B2
(45) Date of Patent: Nov. 6, 2018

(54) PLANAR TRIPLE-IMPLANTED JFET

(71) Applicant: United Silicon Carbide, Inc., Monmouth Junction, NJ (US)

(72) Inventors: Anup Bhalla, Princeton Junction, NJ (US); Zhongda Li, Somerset, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 15/267,177

(22) Filed: Sep. 16, 2016

(65) Prior Publication Data
US 2017/0117392 A1   Apr. 27, 2017

Related U.S. Application Data

(62) Division of application No. 14/918,774, filed on Oct. 21, 2015, now Pat. No. 9,653,618.

(51) Int. Cl.
*H01L 21/337*  (2006.01)
*H01L 29/808*  (2006.01)
(Continued)

(52) U.S. Cl.
CPC ...... *H01L 29/8083* (2013.01); *H01L 21/0465* (2013.01); *H01L 21/266* (2013.01); *H01L 21/26513* (2013.01); *H01L 29/0843* (2013.01); *H01L 29/1058* (2013.01); *H01L 29/1066* (2013.01); *H01L 29/1095* (2013.01);
(Continued)

(58) Field of Classification Search
CPC ............. H01L 21/0465; H01L 29/0843; H01L 29/1058; H01L 29/1095; H01L 29/1608; H01L 29/42316; H01L 29/66068; H01L 29/66909; H01L 29/8083; H01L 21/26513;
(Continued)

(56) References Cited

U.S. PATENT DOCUMENTS 6,303,947 B1   10/2001   Ueno et al.
6,841,812 B2   1/2005    Zhao
(Continued)

FOREIGN PATENT DOCUMENTS

EP   1542270 A1    6/2005
JP   2000252475 A  9/2000

OTHER PUBLICATIONS

International Search Report and the Written Opinion of the International Searching Authority dated Jan. 30, 2017.

*Primary Examiner* — Duy T Nguyen
(74) *Attorney, Agent, or Firm* — Baker & Hostetler LLP

(57) ABSTRACT

A JFET is formed with vertical and horizontal elements made from a high band-gap semiconductor material such as silicon carbide via triple implantation of a substrate comprising an upper drift region and a lower drain region, the triple implantation forming a lower gate, a horizontal channel, and an upper gate, in a portion of the drift region. A source region may be formed through a portion of the top gate, and the top and bottom gates are connected. A vertical channel region is formed adjacent to the planar JFET region and extending through the top gate, horizontal channel, and bottom gate to connect to the drift, such that the lower gate modulates the vertical channel as well as the horizontal channel, and current from the sources flows first through the horizontal channel and then through the vertical channel into the drift.

8 Claims, 22 Drawing Sheets

(51) Int. Cl.
*H01L 21/266* (2006.01)
*H01L 21/265* (2006.01)
*H01L 29/10* (2006.01)
*H01L 29/16* (2006.01)
*H01L 29/66* (2006.01)
*H01L 21/04* (2006.01)
*H01L 29/08* (2006.01)
*H01L 29/423* (2006.01)
*H01L 29/06* (2006.01)

(52) U.S. Cl.
CPC .... H01L 29/1608 (2013.01); H01L 29/42316 (2013.01); H01L 29/66068 (2013.01); H01L 29/66909 (2013.01); *H01L 29/0619* (2013.01); *H01L 29/0692* (2013.01)

(58) Field of Classification Search
CPC ............... H01L 21/266; H01L 29/0619; H01L 29/0692; H01L 29/1066
See application file for complete search history.

(56) References Cited

U.S. PATENT DOCUMENTS

| | | |
|---|---|---|
| 8,169,007 B2 | 5/2012 | Anderson et al. |
| 2003/0089930 A1 | 5/2003 | Zhao |
| 2005/0173726 A1 | 8/2005 | Potts |
| 2011/0284930 A1 | 11/2011 | Hershberger et al. |
| 2012/0168820 A1 | 7/2012 | Liu et al. |
| 2012/0187483 A1 | 7/2012 | Yang et al. |
| 2013/0221418 A1* | 8/2013 | Mitchell ........... H01L 27/11517 257/296 |
| 2014/0346528 A1 | 11/2014 | Hisada et al. |
| 2015/0179688 A1* | 6/2015 | Shinohara ......... H01L 27/14679 257/461 |

\* cited by examiner

Figure 14 – alternative top view

PLANAR TRIPLE-IMPLANTED JFET

CROSS REFERENCE TO RELATED APPLICATIONS

This application is a divisional of U.S. patent application Ser. No. 14/918,774, filed on Oct. 21, 2015 entitled "Planar triple-implanted JFET," now U.S. Pat. No. 9,653,618, the contents of which are hereby incorporated by reference in their entirety.

FIELD OF THE DISCLOSURE

Vertical junction field-effect transistors made from wide bandgap materials such as silicon carbide are useful in power electronic circuits, such as power factor correction (PFC) circuits, DC-DC converters, DC-AC inverters, and motor drives.

SUMMARY

Junction field-effect transistors (JFETs) and methods of constructing JFETs are described herein. A JFET having vertical and horizontal elements may be made from a semiconductor material such as silicon carbide (SiC) by a process using a triple implantation to form a horizontal planar JFET region comprising a lower gate, a horizontal channel, and an upper gate, all above a drift region resting on a drain substrate region. A source region may be formed through a portion of the top gate, and the top and bottom gates are connected. A vertical channel region may be formed adjacent to the planar JFET region and extending through the top gate, horizontal channel, and bottom gate to connect to the drift, such that the lower gate modulates the vertical channel as well as the horizontal channel, and current from the sources flows first through the horizontal channel and then through the vertical channel into the drift region.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying figures. The figures are not necessarily drawn to scale.

FIG. 10 is a vertical cross section of a starting substrate comprising a lower drain region and upper drift region.

FIG. 11 is a vertical cross section of the substrate with triple implant, shown with an implant mask in place.

FIG. 12 is a vertical cross section showing the addition of vertical channel implant, shown with the vertical channel implant mask in place.

FIG. 13 is a vertical cross section showing the addition of a source implant, shown with the source implant mask in place.

FIG. 14 is a perspective view of the active cell of an example triple-implanted JFET in process, showing the surface contact region for the lower gate connection.

FIGS. 15 and 16 are further perspective views of an example cell in process.

FIGS. 17 and 18 are vertical cross sections of an example cell in process

DETAILED DESCRIPTION OF ILLUSTRATIVE EMBODIMENTS

Junction field-effect transistors and methods of constructing JFETs are described herein. A JFET having vertical and horizontal planar elements may be made from a high bandgap semiconductor material such as silicon carbide (SiC) by a process using a triple implantation on a substrate comprising an upper drift region and a lower drain region. The triple implantation is used to form a horizontal planar JFET region comprising a lower gate, a horizontal channel, and an upper gate, all above a drift region resting on a drain substrate region. A source region may be formed through a portion of the top gate, and the top and bottom gates are connected. A vertical channel region is formed adjacent to the planar JFET region and extending through the top gate, horizontal channel, and bottom gate to connect to the drift, such that the lower gate modulates the vertical channel as well as the horizontal channel, and current from the sources flows first through the horizontal channel and then through the vertical channel into the drift.

When making transistors in a wide-bandgap semiconductor material, such as SiC, GaN, AlN, or diamond, JFET-type structures are often preferred over MOS-type structures. This is due to the difficulty of obtaining the same quality of oxide interface as seen with Si/SiO2. This in turn makes it difficult to achieve transistors with the same level of reliability in MOS surface conduction channels, which are prone to degradation. JFETs avoid this issue because JFETs are bulk devices, unlike MOS devices, and do not require surface conduction channels. This is particularly advantageous for high power devices, since surface conduction channel reliability issues are exacerbated at higher operating temperatures.

Figure 1:
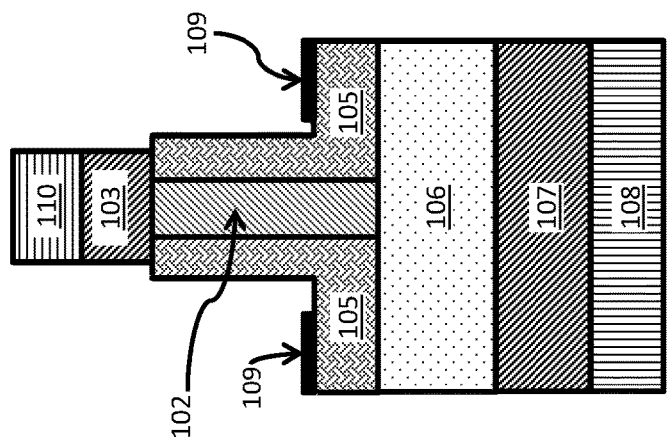
FIG. 1 provides, for reference, a cross section of an active cell of a prior art vertical JFET.

FIG. 1 shows a vertical cross section of the active cell of a prior art vertical trench JFET. The channel 102 and the gate regions 105 form a mesa, with the channel 102 at the center of the mesa. Atop the mesa, the upper source region 103 is in contact with the channel 102. The source contact 110 connects to the source 103. The gate regions 105 are connected to the gate contacts 109. At the bottom of the mesa, the channel 102 connects to the drift region 106. The drift region 106 serves as a voltage blocking layer. The drift region may be grown epitaxially on the substrate drain region 107. The drain 107 is connected to the drain contact 108. The channel 102 may be formed, for example, through epitaxial growth or by implanting at an angle between the gate regions 105 through either or both sides of the mesa.

Precise control of the threshold voltage (Vth) in such a trench vertical JFET may be challenging since Vth varies with the amount and the position of charge in the channel 103. These may be strongly affected by process variations. For example, the mesa width may fluctuate due to variations in the photo process, the etch process, and the etch slope. This may lead to large variations in Vth. These variations may be reduced to some extent by forming the channel 102 by implantation. However, some variation in mesa dimensions and sidewall angles will persist. For example, in order to maintain good blocking capability in the off-state, especially for normally-off devices and normally-on devices with very negative Vth voltages, the vertical structure requires the use of very long channel regions 102. This in turn adds the complexity of deep trench etches, which are quite difficult to control in wide bandgap materials.

Figure 2:
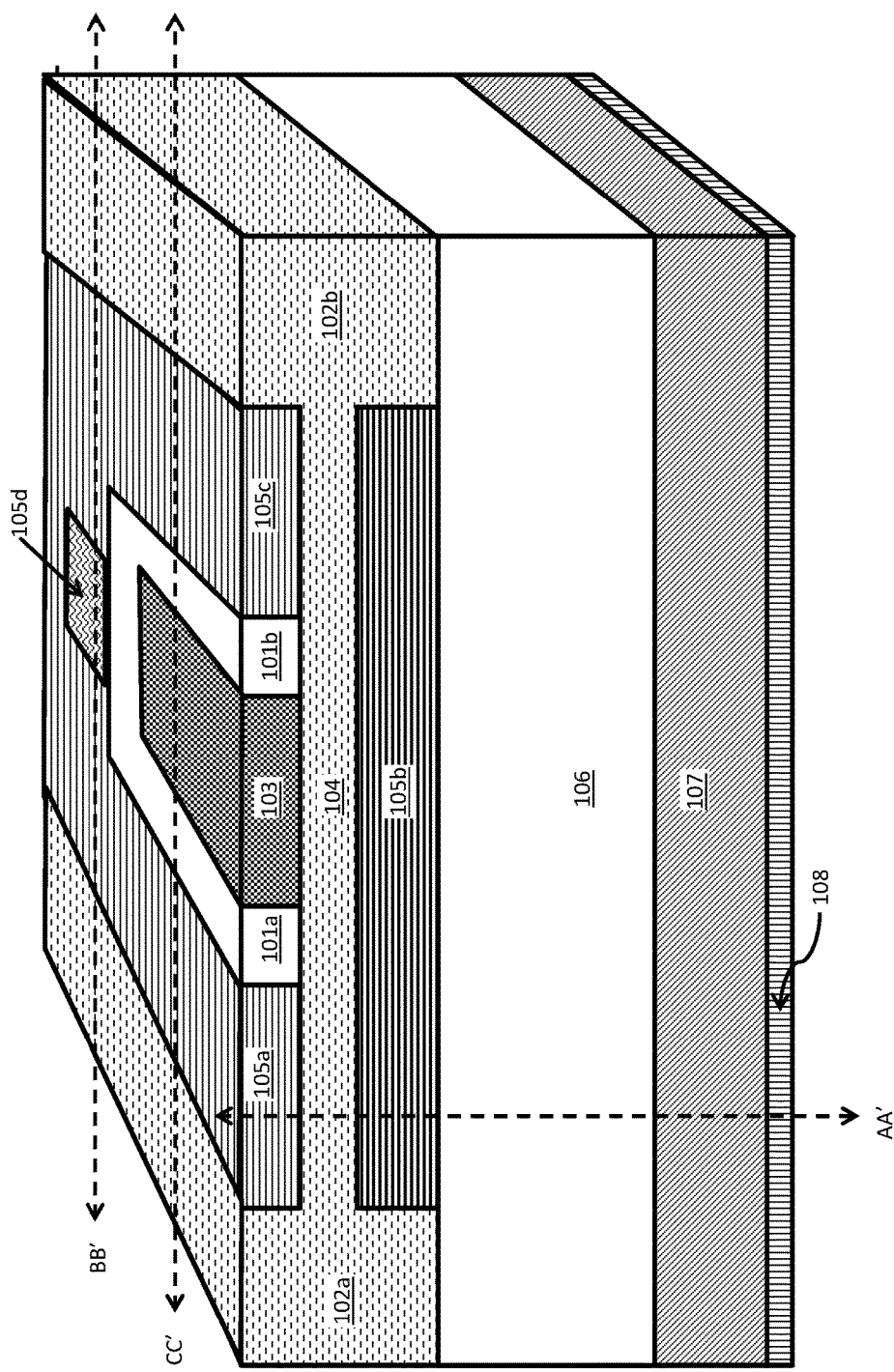
FIG. 2 is a perspective view of a section of an active cell of a first example triple-implanted JFET.

FIG. 2 shows the active cell of a first example of a triple-implanted planar JFET. At the center of the top surface is the source region 103. At the bottom, the drain contact 108 is in contact with the substrate drain region 107. The voltage-blocking drift region 106 is on top of the drain 107. Again, the drift 106 may be formed as an epitaxial layer on top of the substrate drain region 107. The triple-implanted JFET structure is formed by three gate regions 105a, 105b, and 105c, along with an implanted horizontal channel region 104. The horizontal channel 104 leads to two implanted vertical channel regions 102a and 102b. There are separate top gate regions 105a and 105c, and a common bottom gate region 105b. Current from the source 103 flows through the horizontal channel 104 to the vertical channels 102a and 102b. The vertical channels 102a and 102b bring the current to the drift region 106, from where it flows to the drain contact 108 via the drain 107.

The gate regions 105a, 105b and 105c are of the opposite doping type to the drain 107, drift 106, vertical channels 102a and 102b, horizontal channel 104, and source 103. Lightly doped regions 101a and 101b of either doping polarity may be used to increase gate-source breakdown voltage and/or add a source ballast resistance. For example, the lightly doped regions 101a and 101b may be doped at ten percent or less of the doping level of the adjacent source 103 or gates 105a and 105c. Such added source ballast resistance may benefit device operation in short circuit mode, and is particularly useful when the JFET is employed as a current limiting device. The gate connection region 105d is the same polarity as the gate regions 105a, 105b and 105c, but a heavier implant is used to short the top and bottom gates and to provide a sufficient surface doping for good ohmic contact formation.

Figure 3:
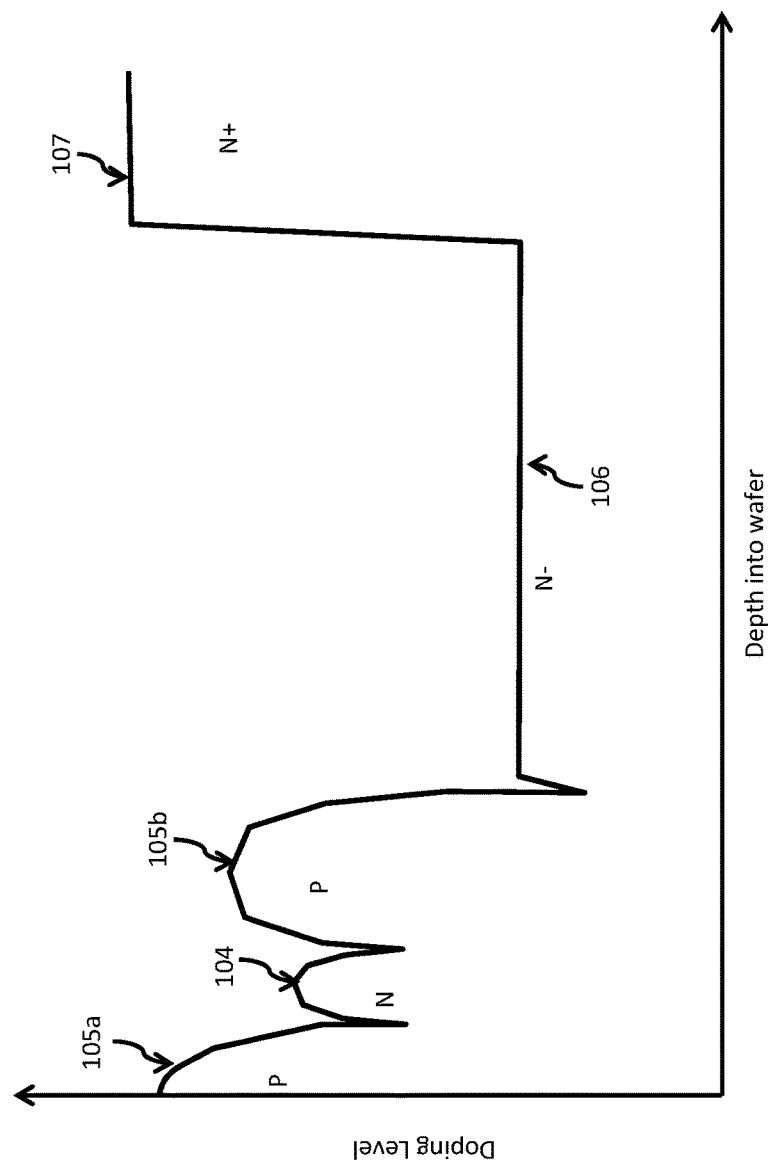
FIG. 3 is a doping profile graph of a triple-implanted JFET such as the first example triple-implanted JFET.

FIG. 3 shows an example doping profile for a triple-implanted n-channel JFET. For a device constructed as shown in FIG. 2, the profile of FIG. 3 may correspond to cross section AA' of FIG. 2. Referring now to FIG. 3, at the right is the N+ doping of the substrate drain region 107. To the left of this is the N− doping of the drift region 106.

At the left of FIG. 3 are the doping profiles of the three regions that may be implanted into the drift region 106 using a common hard mask. At the far left, corresponding to the top of the device, is a top gate 105a. Below this is a channel region 104, and then a bottom gate 105b. The top gate 105a junction depth is quite shallow, and doped enough to not deplete fully when the device is operated at its negative maximum gate-source voltage. The top gate doping is light enough to be easily compensated by the source contact implant which is of the opposite polarity type. The channel implant 104 usually has a peak doping lower than the top gate 105a, and is disposed deeper than top gate 105a. The bottom (or deep) gate region 105b is formed by the highest energy implant to position it below the channel implant. Again, the charge in this region must be at least sufficient for this region to not be fully depleted when the device is operating in drain to source breakdown with maximum reverse gate-source voltage. On the other hand, this doping level is preferably not made too high, in order to minimize implant damage that could affect carrier mobility in the channel region 104.

Figure 4:
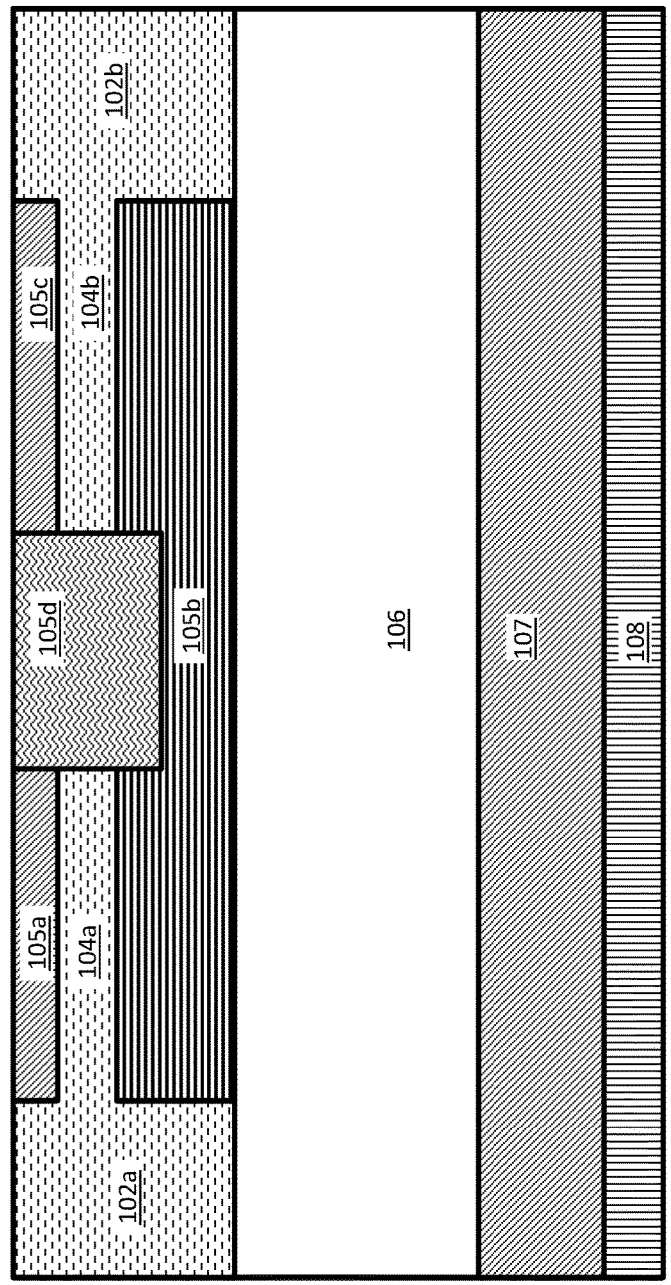
FIG. 4 is a vertical cross section of the first example triple-implanted JFET.

FIG. 4 shows vertical a cross section of the device of FIG. 2, taken along section BB' where the gate contact is made. The top gate regions 105a and 105c are connected to the bottom gate region 105b by the gate connect region 105d. Region 105d is relatively heavily doped at the surface for good ohmic contact, and more moderately doped in the region between the two gates to compensate the channel region dopant. As a result, along cross section BB' region 105d splits the horizontal channel region into regions 104a and 104b to the left and right of 105d. However, away from section BB' these regions 104a and 104b are connected as shown in FIG. 2 as region 104.

Figure 5:
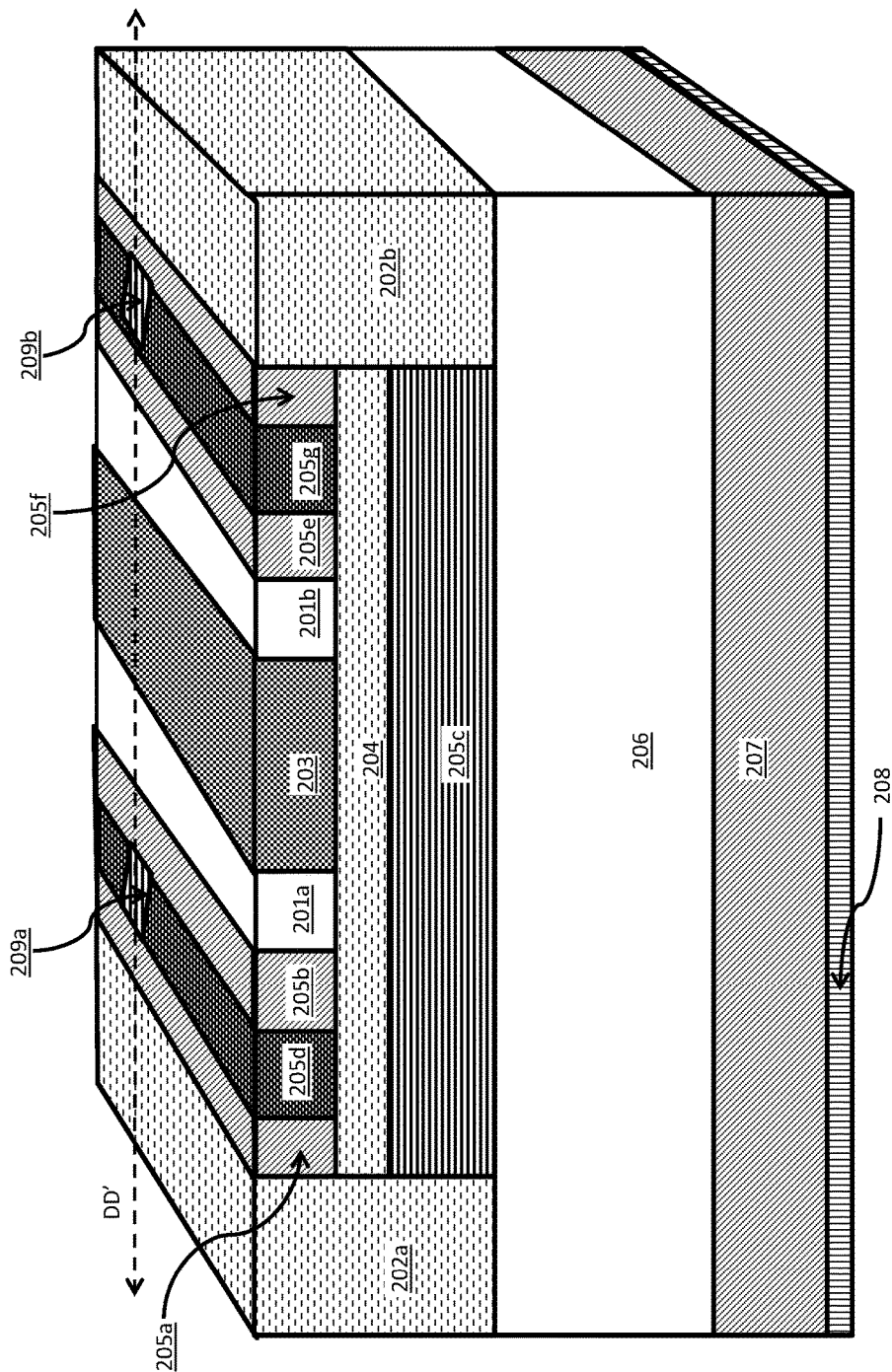
FIG. 5 is a perspective view drawing of an active cell of a second example triple-implanted JFET.

FIG. 5 shows the active cell of a second example of a triple-implanted JFET. In this device, the current from the central source region 203 flows to the left through the horizontal channel region 204 between the upper gate regions 205a and 205b and lower gate region 205c into vertical channel regions 202a. Current also flows from the source 203 to the right between upper gate regions 205e and 205f and lower gate region 205c to vertical channel region 202b. From the vertical channel regions 202a and 202b, the current flows to the drift region 206, then through the substrate 207 to the drain contact 208. As in the first example JFET of FIG. 2, here in FIG. 5 the transistor has both top gates regions 205a, 205b, 205e, and 205f, and a common bottom gate 205c. Here the gate ohmic contact regions 205d and 205g are disposed along the channel, and may be much more heavily doped, and shallower than the top gate regions 205a, 205b, 205e, and 205f. Lightly doped regions 201a and 201b of either doping polarity may be used to add source ballast resistance, and/or improve gate-source breakdown voltage. The lightly doped regions 201a and 201b may be doped, for example, at ten percent or less of the level of doping of the adjacent source 203, or of the gates 205b and 205e. The gate contact zones 209a and 209b connect to both the gate ohmic contact regions 205d and 205g and the lower gate regions 205c.

Figure 6:
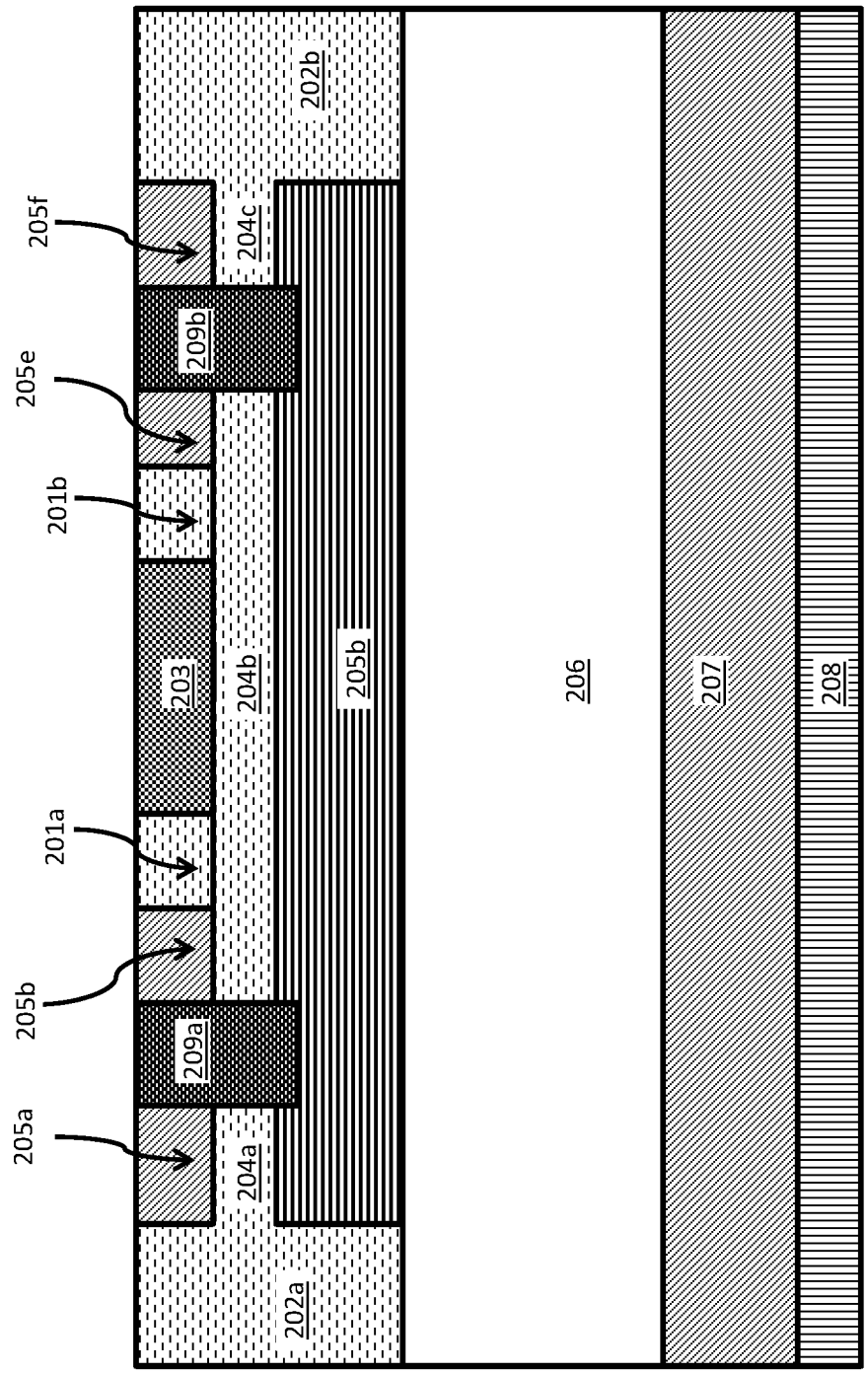
FIG. 6 is a vertical cross section of the second example triple-implanted JFET.

FIG. 6 shows a cross section of the device of FIG. 5 along section DD'. An additional mask and implant may be used to form the deeper gate contact zones 209a and 209b that connect to the lower gate region 205c. Note how here the horizontal channel region is divided into regions 204a, 204b, and 204c along section BB' by the contact zones 209a and 209b, whereas away from section BB' region 204 is contiguous.

Figure 7:
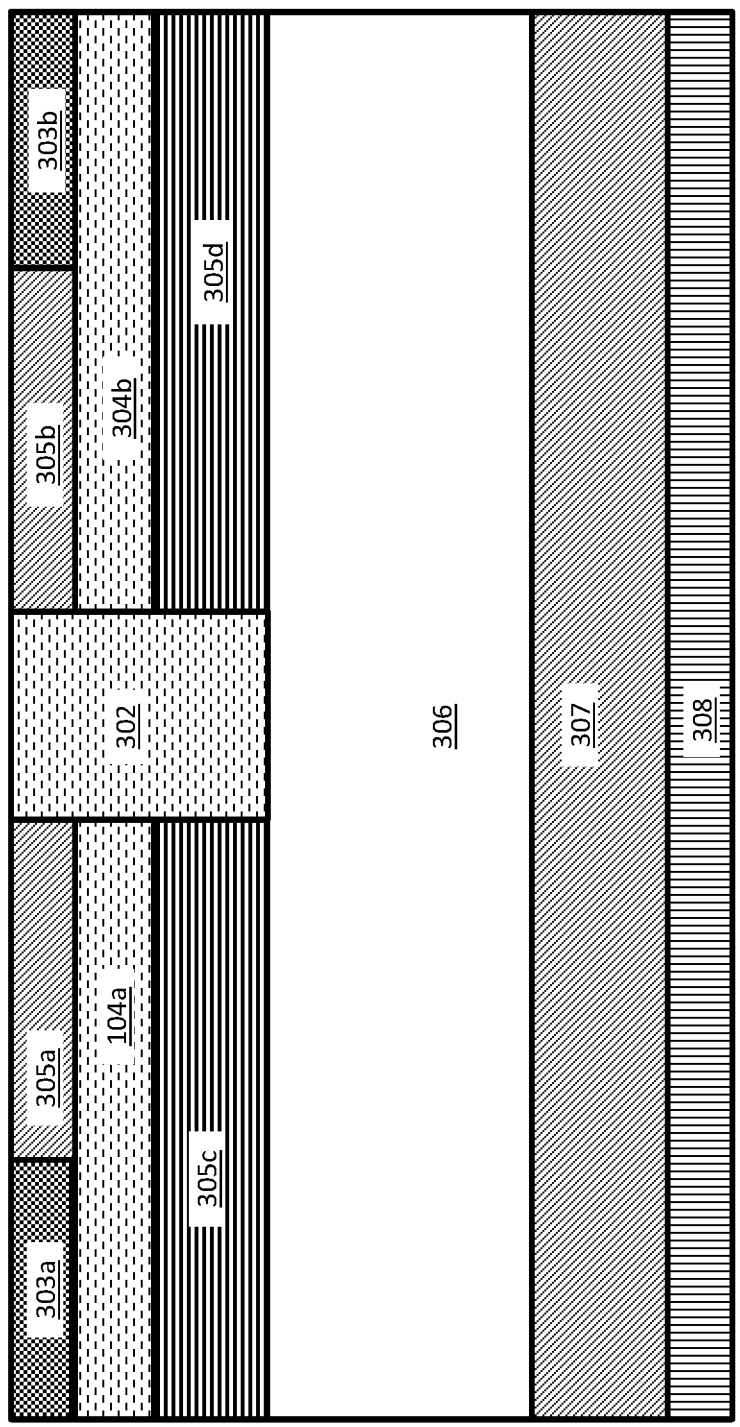
FIG. 7 is a vertical cross section showing the interconnection of gate structures in an example triple-implanted JFET.

FIG. 7 shows the active cell of the triple-implanted JFET shown in FIG. 4, where the vertical channel region 302 is at the center of the cell. This device in effect has two series connected JFETs, one that is lateral, and one that is vertical. The lateral JFET is split into two parts. On the left side, the current flows from the source region 303a laterally via the horizontal channel region 304a to the common vertical channel region 302, passing between the gate regions 305a and 305c. Similarly, on the right side, the current flows from source 303b laterally via the channel region 304b to the common vertical channel region 302, passing between the gate regions 305b and 305d.

The vertical JFET is formed by the combination of bottom gate regions 305c and 305d and the vertical channel region 302. The current from lateral channels 304a and 304b flows down the vertical channel 302 between the gate regions 305d and 305d, and then into the drift region 306, and from there into the substrate drain region 307 and ultimately to the drain contact 308.

The lateral JFET sets the device threshold voltage, Vth. The vertical JFET is useful in shielding the lateral channels 304a-b from the effects of high drain bias once the region between 305c and 305d has been depleted. In making devices where low on-resistance and short channel lengths are required, this feature allows the designer to make the lateral channels quite short without suffering from drain bias induced barrier lowering and the loss of blocking capability. This is particularly useful in making normally-off JFETs. In the case of 4H-SiC normally-off JFETs, the device Vth must ideally be kept close to 1V with +/−0.2V control. This is because the gate drive voltage should be kept between 2.5-3V to limit the maximum gate current that results from forward biasing the gate-source junction. Given that the overdrive voltage available is just 2.5V−1V=1.5V, a short channel is needed to get a high on-state current. In the trench structure, this is not possible without degrading the blocking capability of the device, so a high cell repeat density must be used. The shielding effect of the lower gate may be employed to minimize channel length. By disposing the peak of the channel implant close to the top gate junction, a higher channel charge is also possible for the same Vth, further allowing a high transconductance for normally-off devices.

While connecting the bottom gate regions 305c and 304d to the gate potential instead of to the source potential increases the gate-drain capacitance, it serves the purpose of depleting both the lateral channels 304a and 304b and the vertical channel 302 channels much more effectively. This in turn allows a greater doping level in the lateral and vertical channel 302, leading to lower specific on-resistance.

Figure 8:
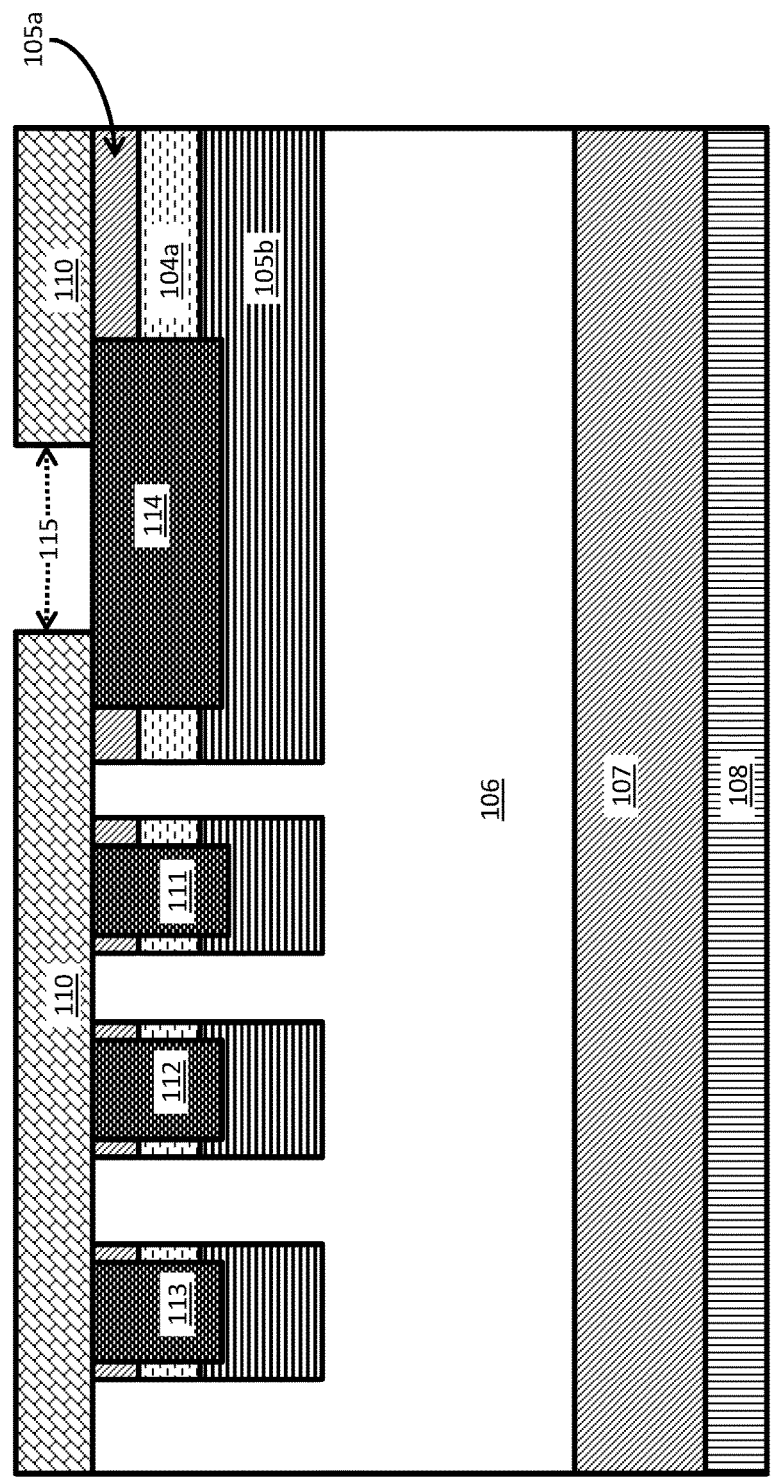
FIGS. 8 and 9 are vertical cross sections of termination regions of example triple-implanted JFETs showing how the same set of implants may be used to form the gate pickup areas as well as the termination guard rings.

FIG. 8 shows how the gate bus and gate pad pickup areas may be formed adjacent to the termination zone of triple-implanted JFET devices, e.g., for the device shown in FIG. 2. In FIG. 8, a passivation dielectric 110 lies above the termination zone. Implant 114 bridges the top gate 105a and bottom gate and 105c layers through the intervening horizontal channel implant region section 104a. Implant 114 has a heavy surface doping for good ohmic contact. A contact gap 115 may be used to connect to the gate bus that distributes the gate signal around the device. The termination may use floating guard rings 111, 112 and 113 by the same material that is used to form the same gate bridging implant 114. Of course, other known techniques of junction termination may be independently applied to the device.

Figure 9:
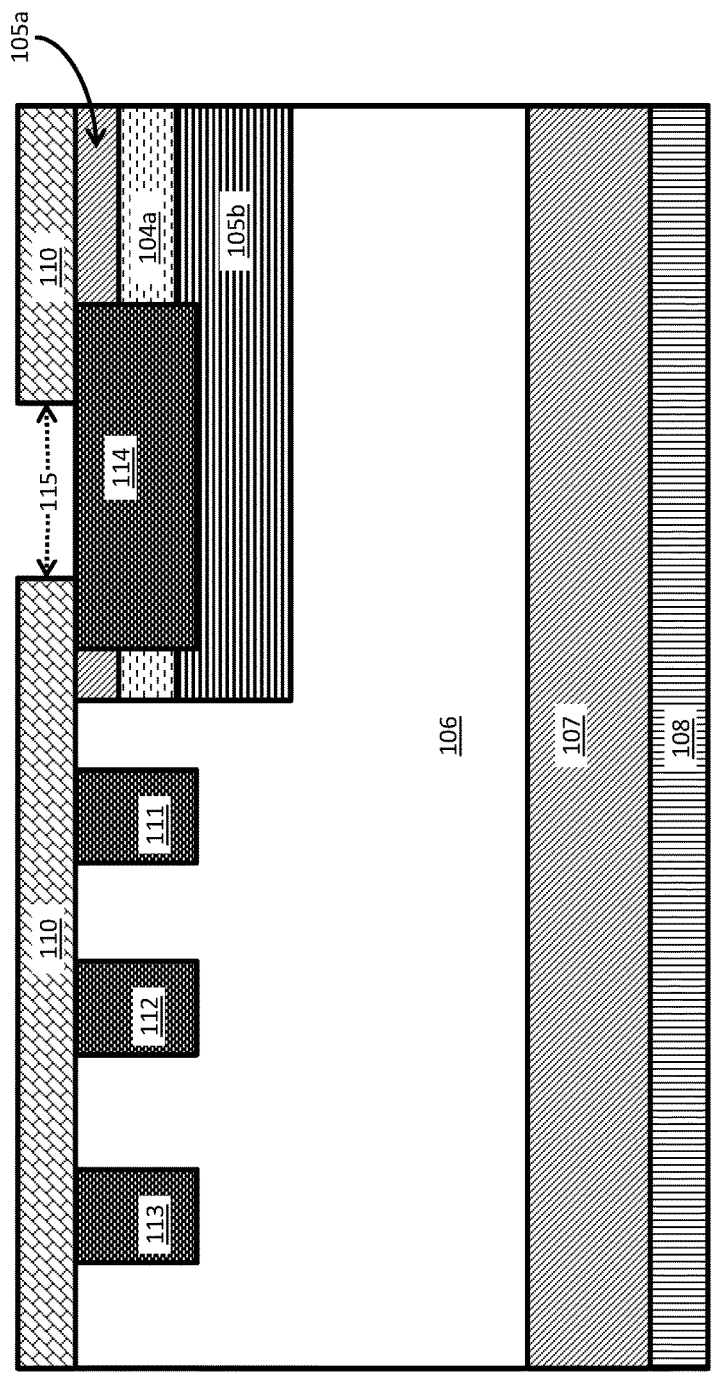

FIG. 9 is similar to FIG. 8. The difference in the example of FIG. 9 is that the guard rings are formed only using the heavier implants used to form the bridge between the top and bottom gates, but the actual top and bottom gate implants are not used.

FIGS. 10 to 18 show an example of a process for the manufacture of a triple-implanted JFET in a high-bandgap semiconductor material such as 4H-SiC. For purposes of illustration, FIGS. 10 through 18 show the construction of the first example triple-implanted JFET as described in reference to FIG. 2. However, it will be appreciated that this process, and variations thereof, may also be used to create a variety of triple-implanted devices including, but not limited to, the second example JFET discussed in reference to FIG. 5. Similarly, the device may be fabricated with variants of this flow in different materials to achieve the similar structures.

Figure 10:
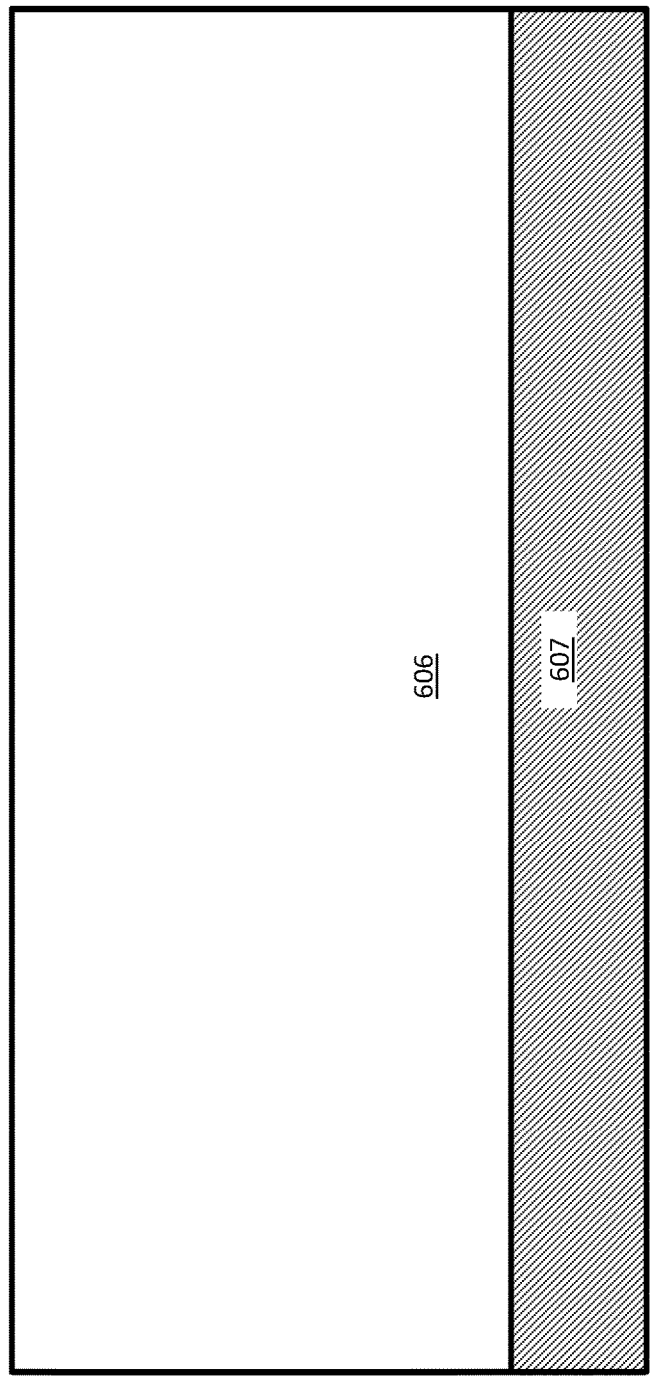
FIGS. 10-18 illustrate an exemplary process for fabricating triple-implant JFETs.

FIG. 10 is a vertical cross section of the shows starting material, which consists of the drift region 606 on top of the substrate 607. Both are of a first doping type. The drift 606 may be grown epitaxially on the substrate 607.

Figure 11:
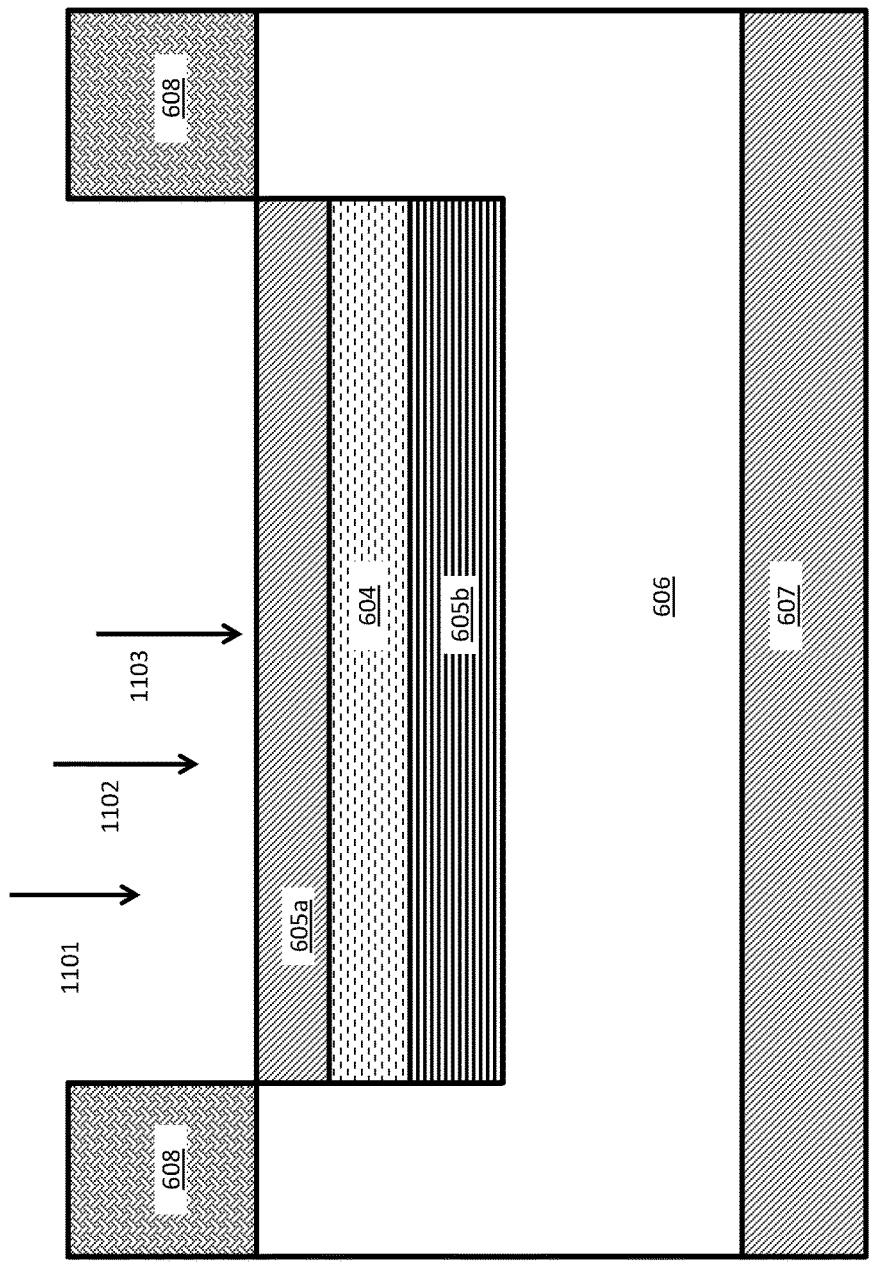

FIG. 11 shows the start of the process. A thick patterned mask 608 capable of blocking all the subsequent implants is formed on the surface. Three implants, 1101, 1102, and 1103 are applied and affect the unmasked areas of the drift 606. Top gate region 605a is created with a low energy implant 1101 of the second doping type. Bottom gate region 605b is created with a high energy implant 1102 of the second doping type. With the same mask, the channel implant 1103 is also performed to create the channel region 604. Thereafter mask 608 may be removed. In the case of an n-JFET in 4H-SiC, mask 608 may be a thick oxide hard mask, for example, to block high temperature Al implants for the top and bottom gates, and an N implant for the channel.

Figure 12:
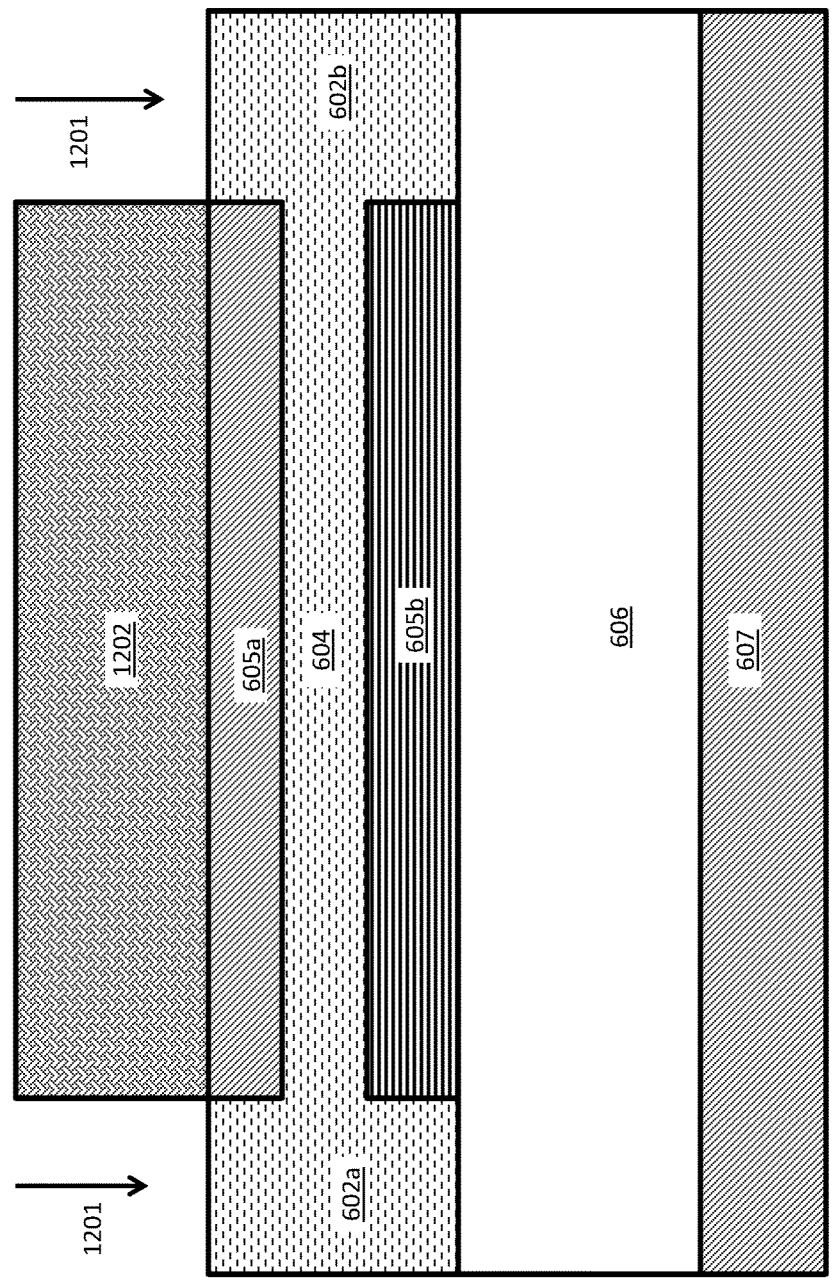

In FIG. 12, a new mask 1202 is applied. Mask 1202 blocks the implant in all regions outside of the active cell array, not shown. This includes areas such as the gate bus, gate pad, and termination regions. Mask 1202 is opened between the triple-implanted zones in the active area. An implant 1201 of the second doping type is then applied to form vertical channel regions 602a and 602b in the exposed drift regions. This implant may be designed with an overlap into the channel defined by the previous mask in order to mitigate threshold voltage variations from edge effects caused by hard mask slope and deep gate implantation ion scattering. The implant may also be designed to have a depth deeper than the bottom gate in order to optimize the trade-off between breakdown voltage and reduced on-resistance from current spreading. Mask 1202 is then removed. In a 4H-SiC n-JFET, Mask 1202 could be either a hard mask or a photoresist mask, for example.

Mask 1202 may also be opened at the outer termination edge for the creation of a channel stop, along with the subsequent source implant.

Figure 13:
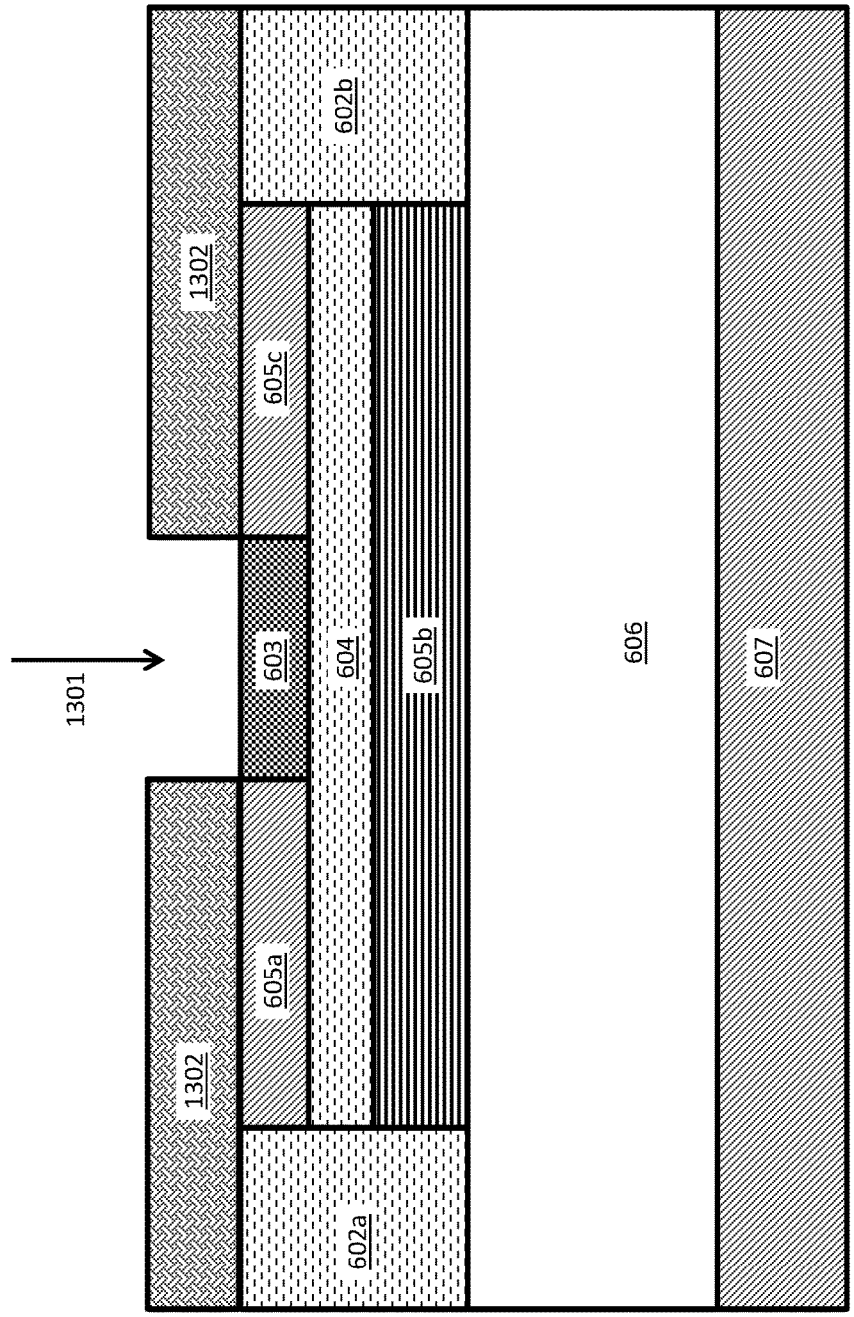

In FIG. 13 a mask 1302 is applied to pattern an implant 1301 of the first dopant type. Implant 1301 is used to create the source region 603, thereby splitting the gate top into regions 605a and 605c. Mask 1302 may then be removed. Mask 1302 may be, for example, a hard mask or a photoresist mask.

The energy of implant 1301 is selected to balance design considerations. Region 603 should be deep enough to connect to the channel 604. However, it is preferable that implant 1301 does not increase the doping at the junction of the channel 604 to bottom gate 605b. This avoids or reduces any loss of gate-source breakdown or any increased leakage in the gate-source junction. Of course, the designer may also tune this depth. For example, a specific zener clamp voltage may be desired between the gate and source.

Figure 14:
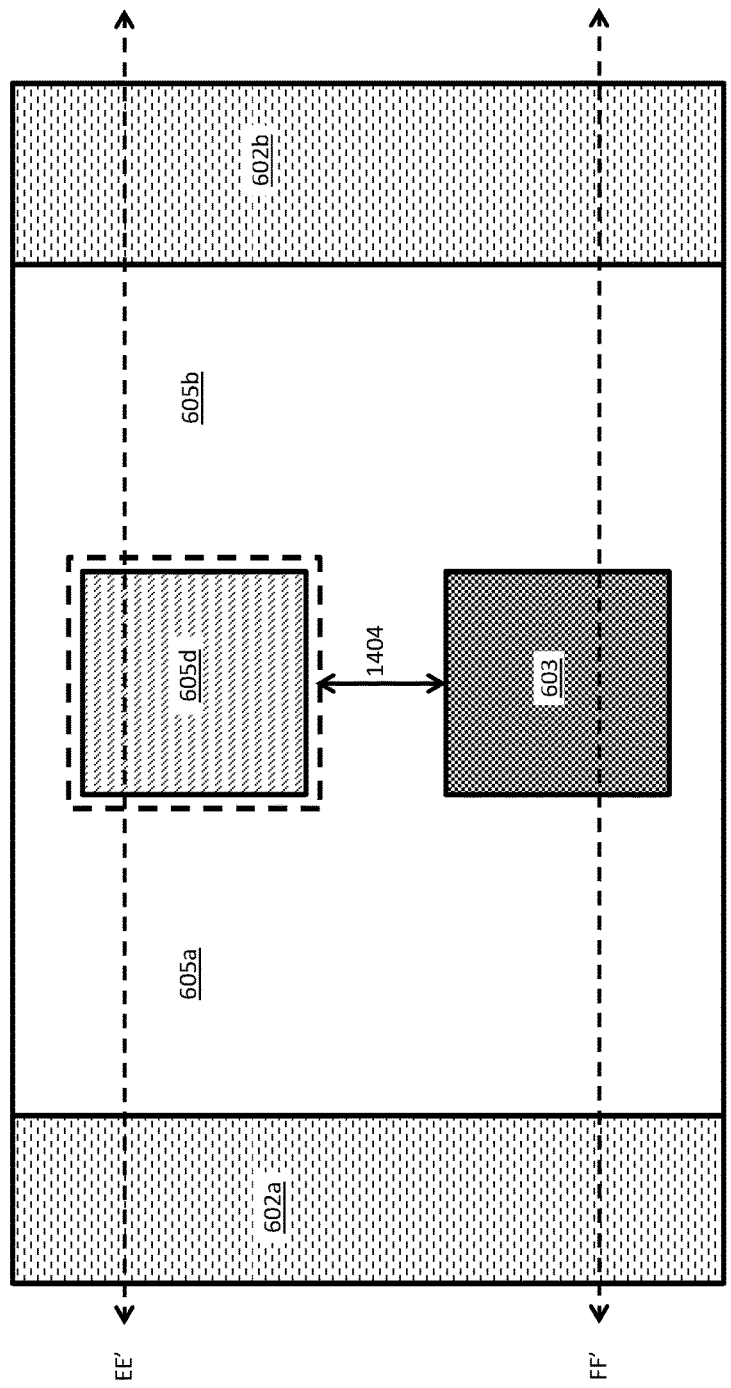

FIG. 14 shows a top view of the wafer in process. A mask with an opening in is applied, allowing gate contact region 605d to be created through the opening via implantation. The implantation may include both gate surface enrichment implant and a gate top to gate bottom bridging implant. The former aids ohmic connection to the gates. The latter connects the top and bottom gate layers. To allow for mask alignment tolerances, a minimum gap 1404, e.g., 0.1 to 0.5 microns should be maintained between the heavy doped source region 603 and gate ohmic region 605d. This aids in maximizing gate-source breakdown and minimizing leakage.

Figure 15:
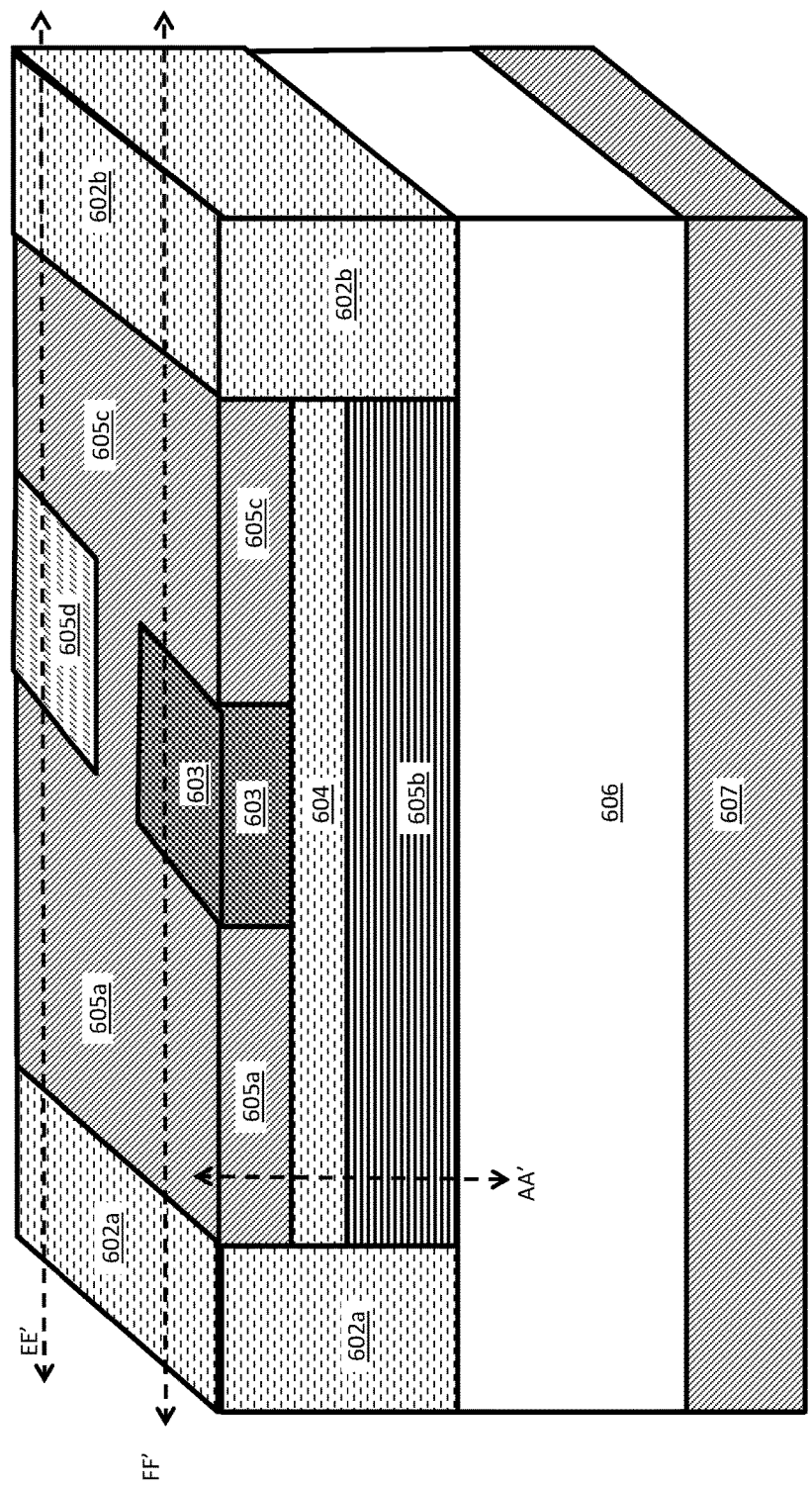

FIG. 15 shows the appearance of the cell after all implants are done and all surface films are stripped prior to implant anneal. In the case of a 4H-SiC device, implant anneals may be carried out at temperatures exceeding 1600 degrees C., with a graphite cap to prevent surface degradation, or any other technique commonly used in the art.

Figure 16:
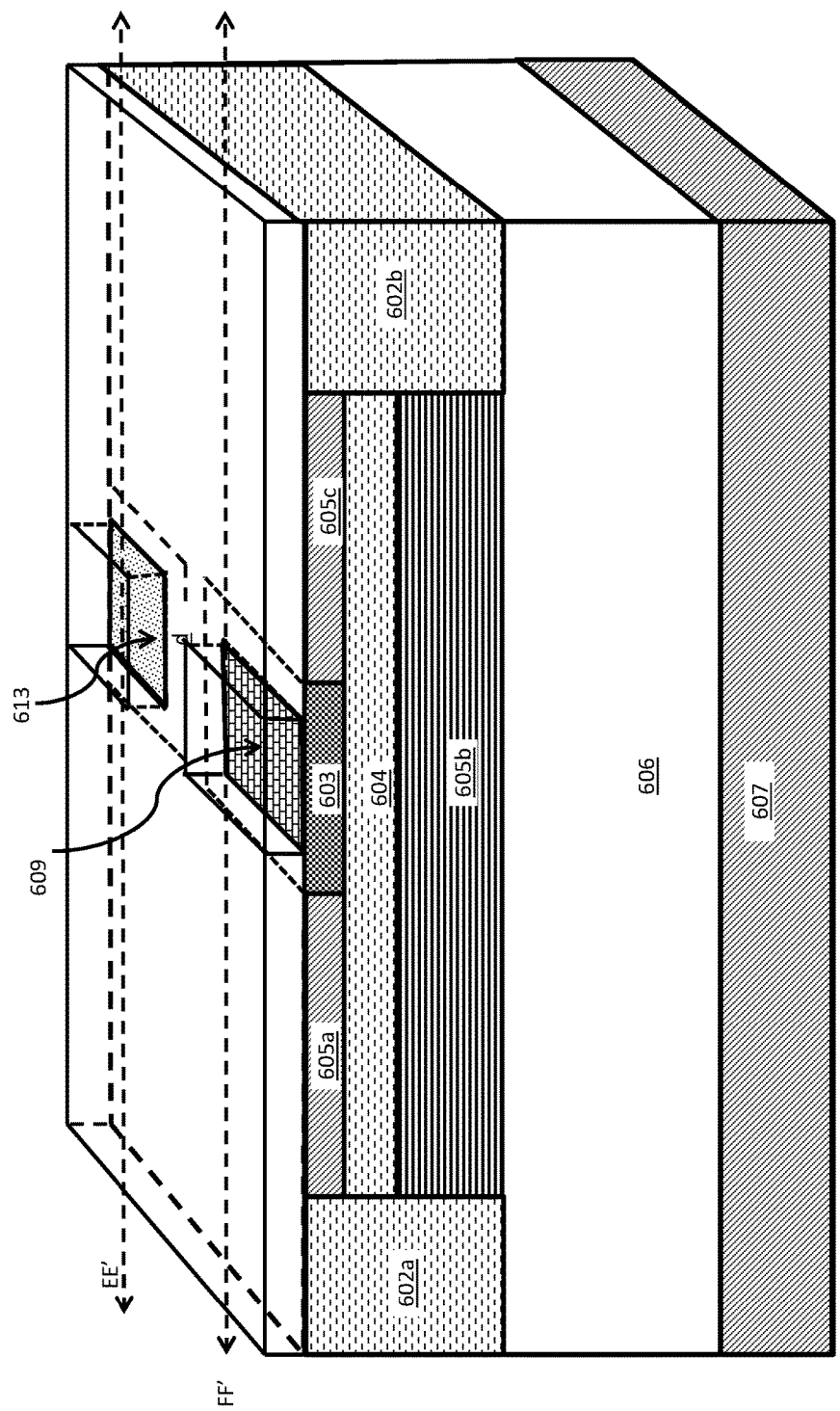

Once the implants are activated, the surface is cleaned and a dielectric is deposited. FIG. 16 shows a 4H-SiC device with an oxide mask, opened at the separate source and gate contacts. A two-step silicidation process may be used to form silicided regions 609 and 613 with $NiSi_2$. Alternatively, a two-mask approach may be used to form separate silicides in the N− and P− regions by opening each contact zone in turn.

Figure 17:
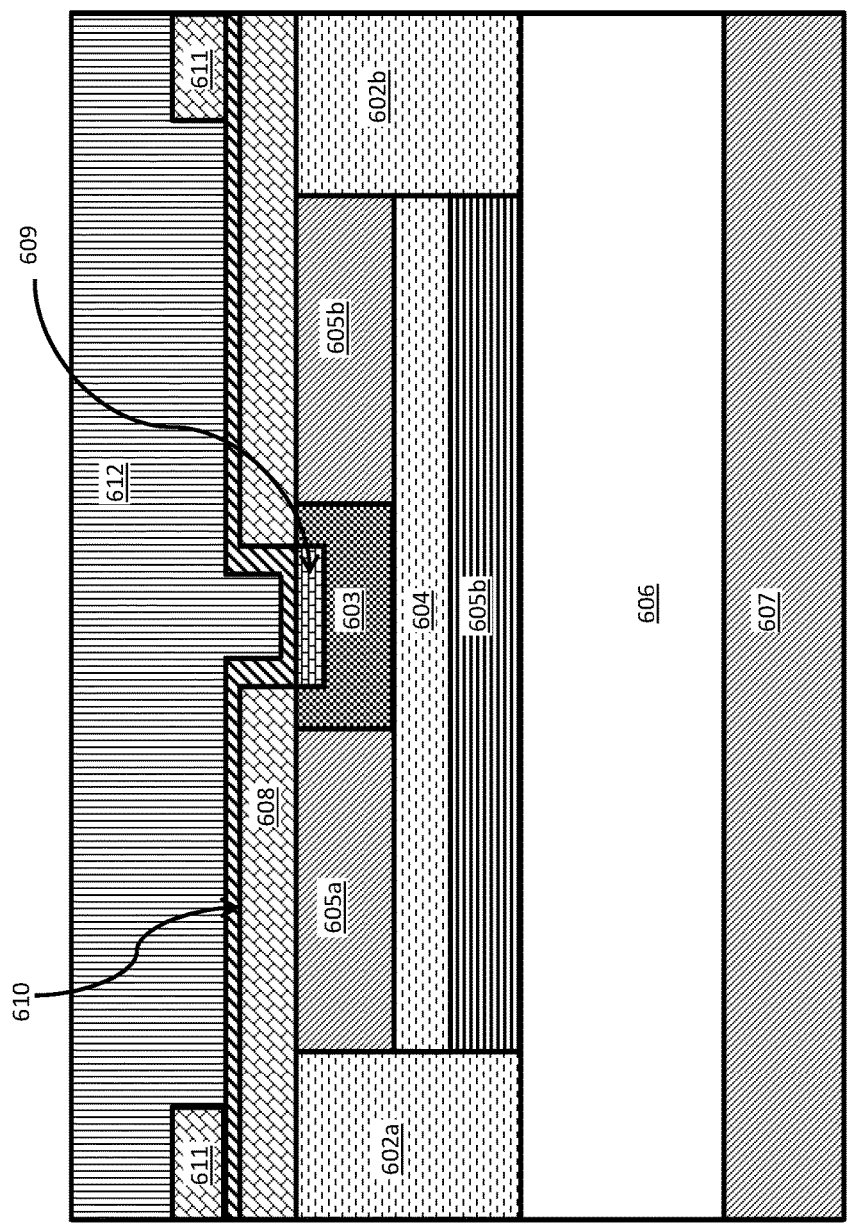

FIG. 17 shows the device cross section though the source contact along section FF' of FIG. 16. A first metal layer 610, such as titanium topped by titanium-tungsten (Ti/TiW) is deposited on the first dielectric 608, and patterned with a metal pattern mask, not shown. Then a second dielectric 611 is deposited and patterned with a via pattern mask, followed by the deposition and patterning of the final metal layer 612. The final metal layer 612 may be might be titanium topped by aluminum (Ti/Al.) A thick Al layer is typically suitable for active area bonding for high current devices.

Figure 18:
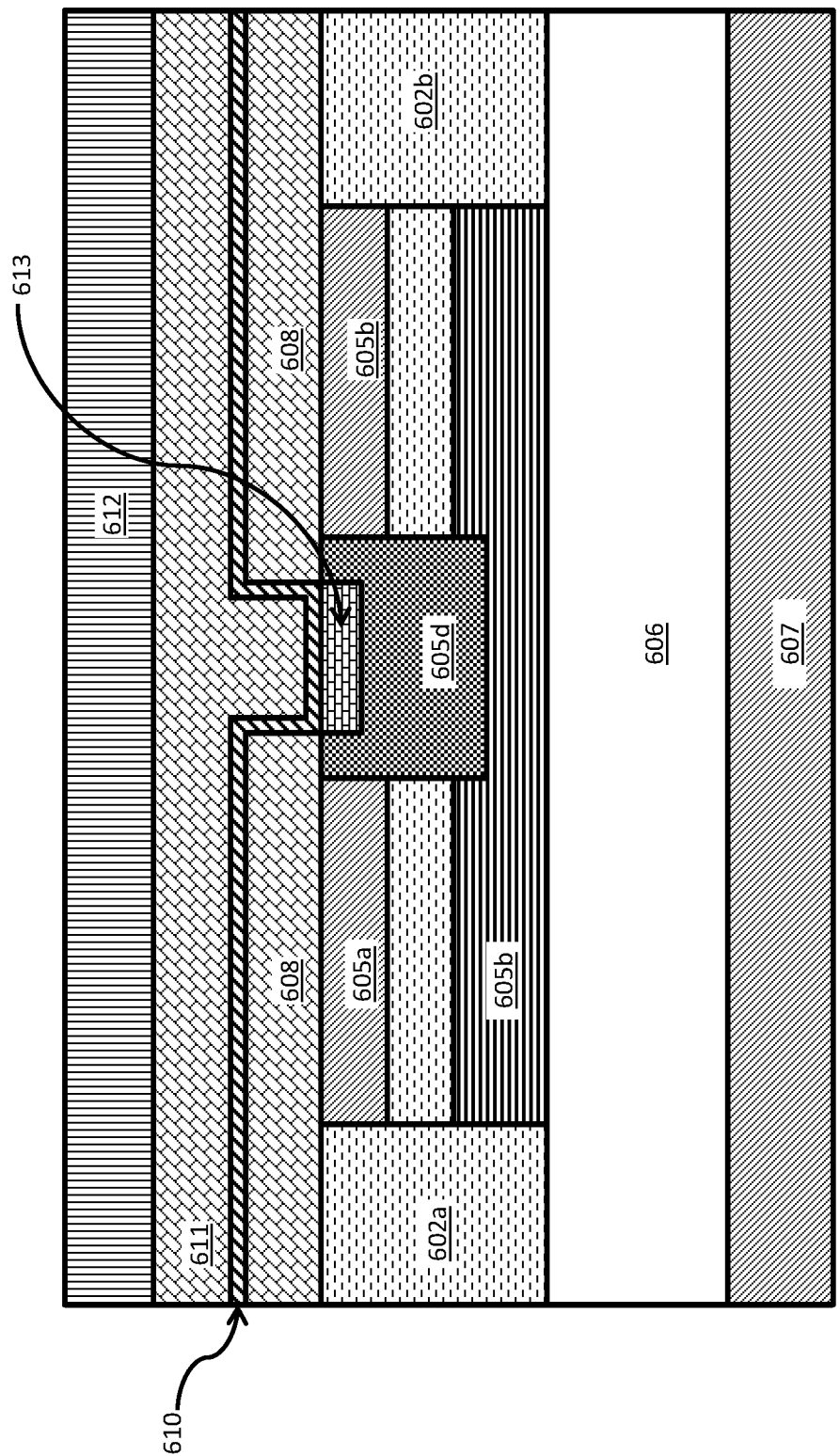

FIG. 18 shows a vertical cross section in the gate pickup region, along section EE' of FIG. 16. This shows the active area after the steps described in reference to FIG. 17 are completed. Referring to FIG. 18, the Ti/TiW metal layer 610 connects to the gate silicide 613 that makes contact to the top and bottom gates via the heavier doped region 605d. The metal 610 is patterned so that the line running to the gate is isolated from the source and serves to bring the gate signal to the gate bus at the device periphery. The dielectric region 611 isolates the gate metal 610 from the source metal 612 everywhere in the active area, while the dielectric region 608 keeps this thin gate metal isolated from the underlying JFET cell.

Figure 19:
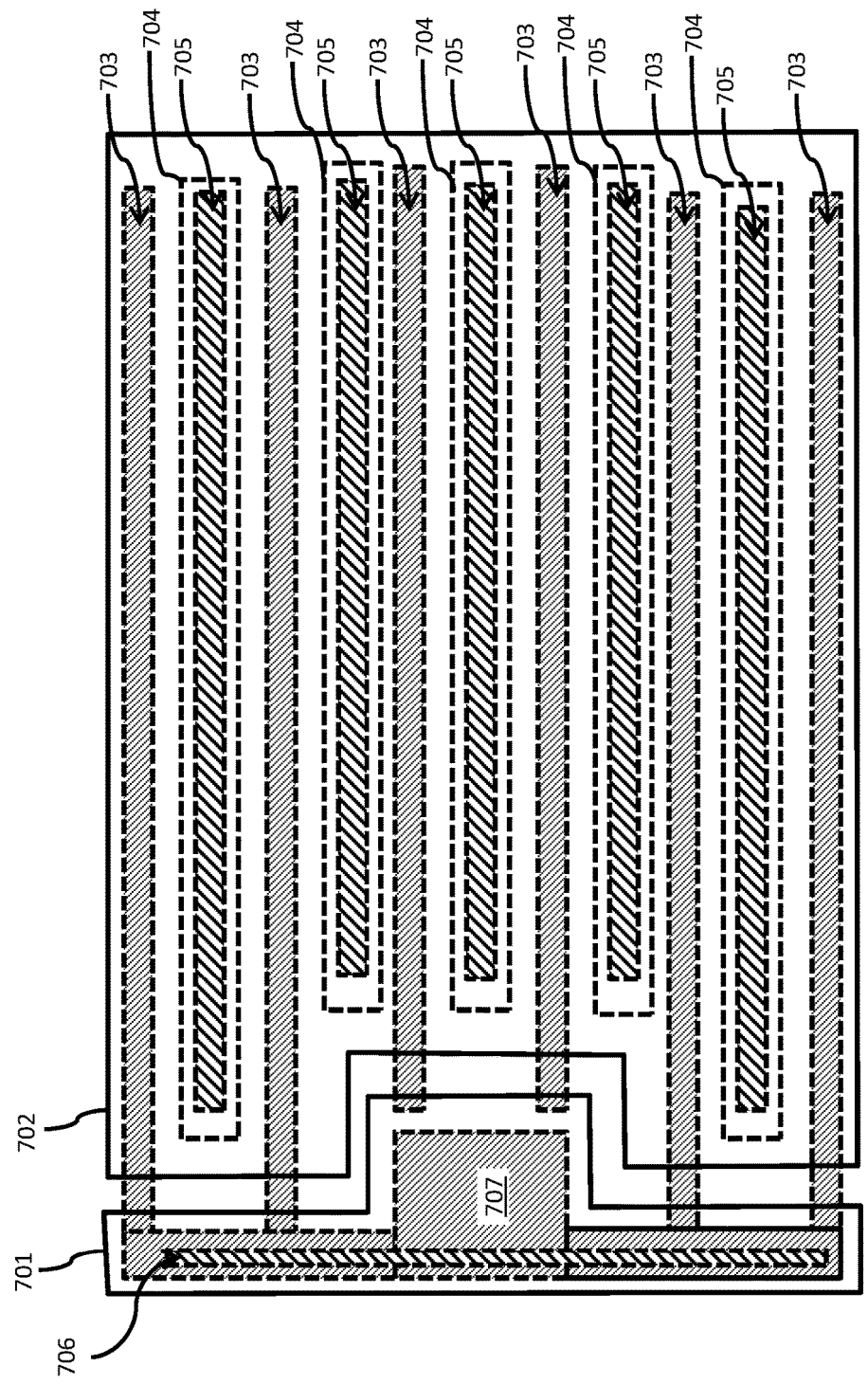
FIG. 19 is a top view showing an exemplary layout of the metal layers of a triple-implanted JFET, including both the active and termination regions.

FIG. 19 shows a top view of a simple stripe cell layout of an example device. The regions 703 with dashed outlines are gate metal lines formed in the first thinner metal layer. They connect to the edge of the die on the left. Via 706 connects the gate metal lines 703 to the final, thicker metal in region 701, shown with a solid outline. Region 701 is the gate buss. Region 707 is a pad where a gate bond wire may be placed. The source regions are connected to a separate section 704 of the first, thinner metal layer. Vias 705 open a path through the upper dielectric connecting the source metal lines 704 to the source metal pad 702 formed in the upper metal layer. It will be appreciated that many design variations are possible to use the two metal layers to address the gate and source current distribution in triple-implanted JFET devices described herein.

Figure 20:
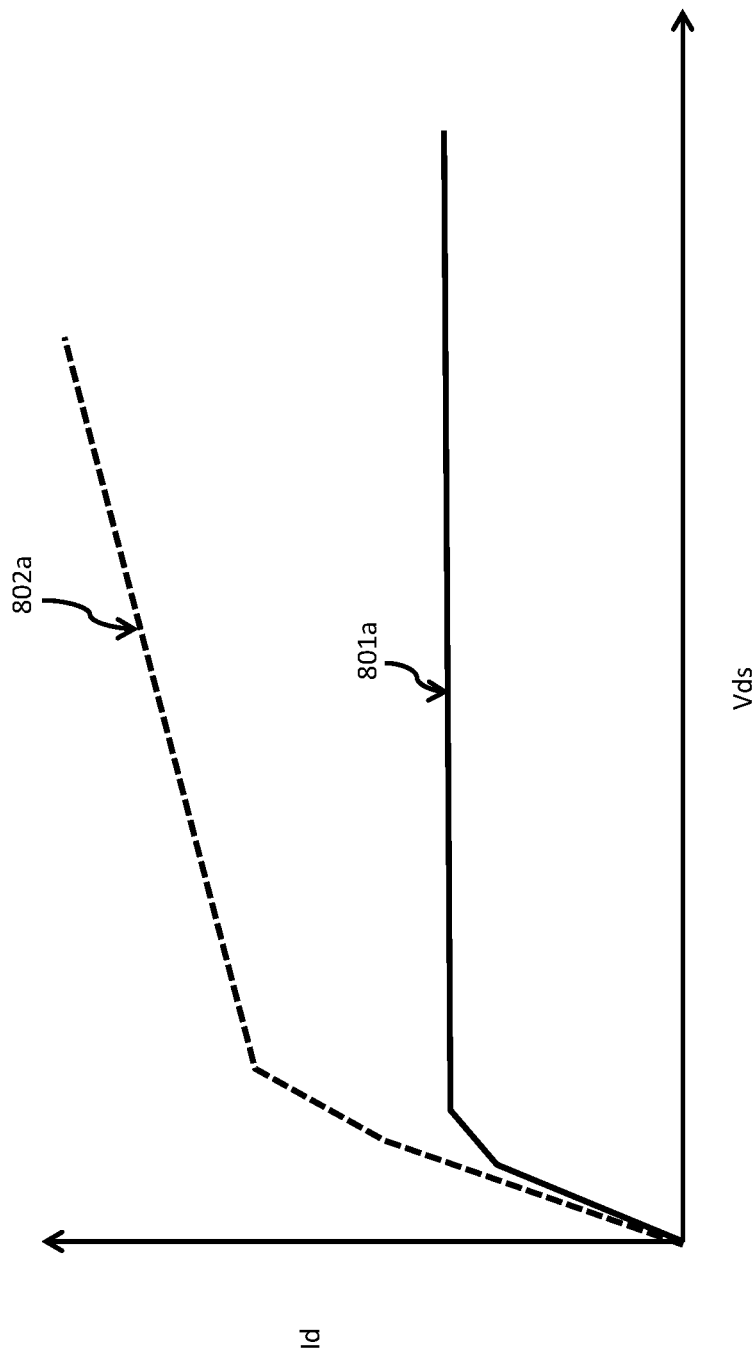
FIG. 20 is a graph of exemplary drain conduction versus drain-source voltage triple-implanted JFET devices versus prior art devices.

FIG. 20 shows the output drain current (Id) versus drain-source voltage (Vds) characteristics 801a of triple-implanted JFET devices as described herein as compared with the Id-Vds characteristics 802a of prior art devices. The flat current in curve 801a after saturation, and tight control over saturation current levels, are very useful for current limiting applications. They result from a number of factors, including the shielding effect of the lower gate and vertical channel region, the longer channel length based on lateral cell dimensions now possible without deep trench etching, and the ease with which a source ballast resistance may be formed within the cell.

Figure 21:
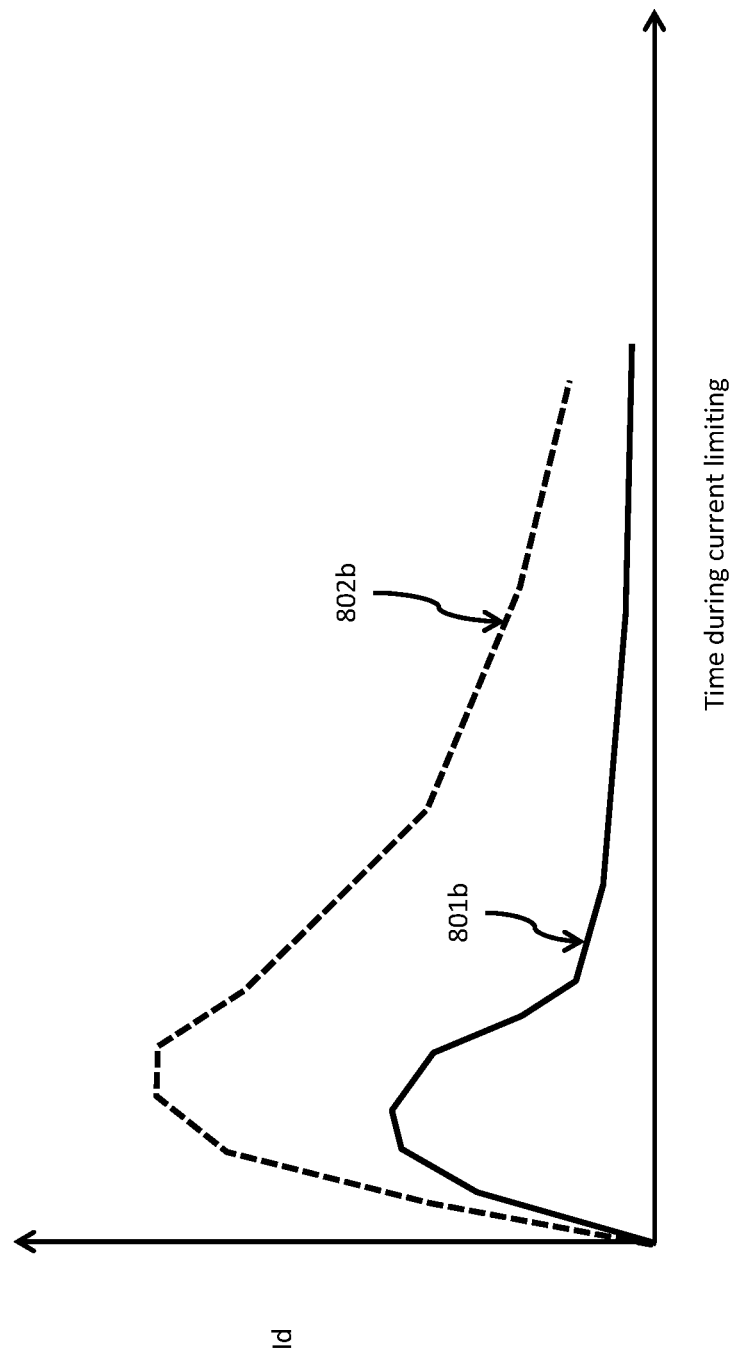
FIG. 21 is a graph of short-circuit transient performance of an exemplary triple-implanted JFET device versus the performance an exemplary prior art device.

FIG. 21 shows the results of the use of the source ballast resistance, e.g., a long channel length, on the device current versus time in response to a surge such as a lightning strike. Curve 801b is for a triple-implanted JFET device as described herein, and curve 802b is for prior art devices. The new structure lets through much lower energy, which may be estimated by integrating the area under the square of the current versus time curve. Another useful aspect of this structure is the low internal gate resistance (Rg) possible with designs using two metal layers. That in turn prevents any excess drain current due to dV/dt induced turn-on caused by a displacement current through the internal Rg.

Figure 22:
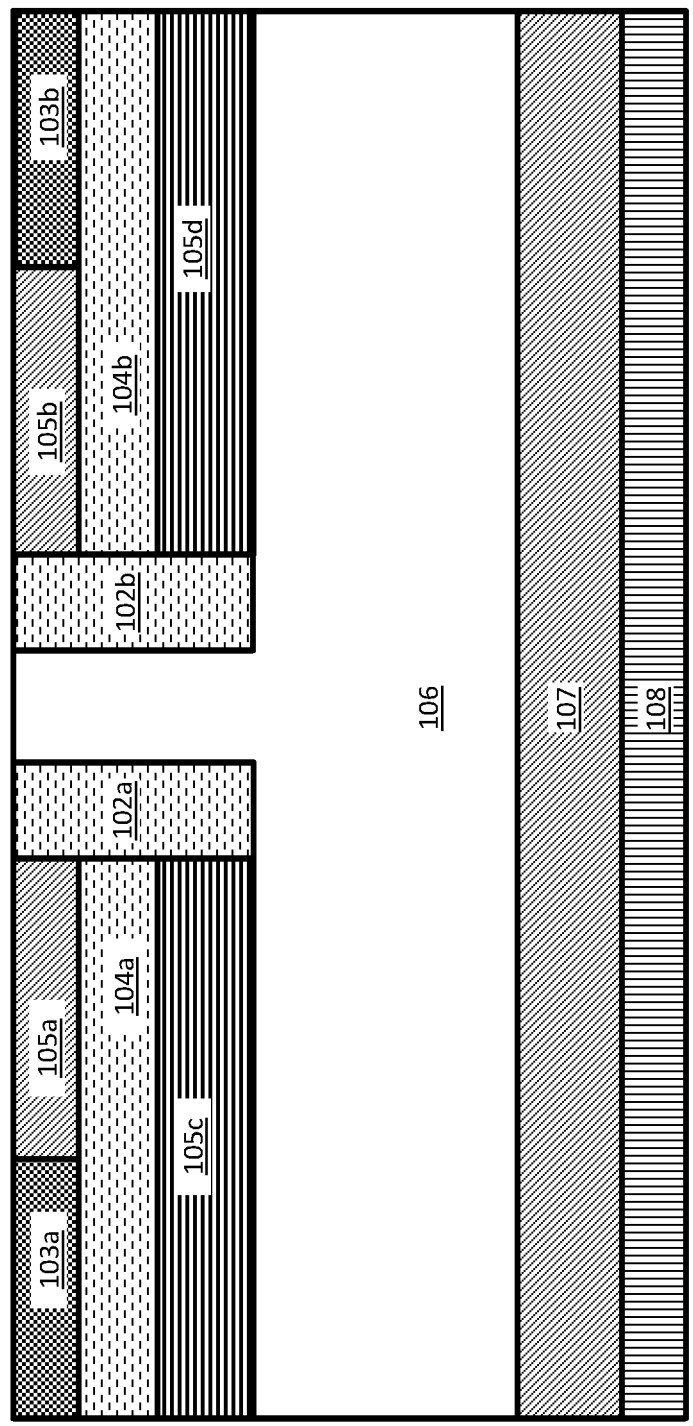
FIG. 22 is a vertical cross section of a third example triple-implanted JFET with a vertical channel region formed by angled implant using the same mask as used for the triple implant.

FIG. 22 shows a third embodiment, where the vertical channel JFET regions 102a and 102b are formed by angled implantation using the same mask window as that used for the triple implant that forms the top gate regions 105a and 105b, the bottom gate regions 105c and 105d, and the horizontal channel regions 104a and 104b. Using the same mask avoids any misalignment problems between the vertical channel and triple implanted zones. However, since JFET regions 102a and 102b may have a higher peak concentration than the channel regions 104a and 104b, it would require a significantly higher dose for the deeper gate 105c and 105d to ensure conversion to p-type behavior. On the other hand, the energy of the implants 102a and 102b may be selected to be high enough to form a current spreading layer under the deep gate to further enhance on-resistance at the expense of a lower device breakdown voltage.

In describing embodiments of the subject matter of the present disclosure, as illustrated in the figures, specific terminology is employed for the sake of clarity. The claimed subject matter, however, is not intended to be limited to the specific terminology so selected, and it is to be understood that each specific element includes all technical equivalents that operate in a similar manner to accomplish a similar purpose.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method for creating a junction field-effect transistor (JFET), comprising:
   a. applying a first mask to a wafer to form a first patterned hard masking layer to the top of the wafer, the wafer comprising an upper drift region and a bottom drain region;
   b. with the first mask in place, applying three implants to a first unmasked portion of the top of the wafer to form a first lower gate, a first horizontal channel, and a first top gate in an upper portion of the drift region;
   c. forming a first source in a portion of the first top gate;
   d. connecting the first top gate to the first lower gate; and
   e. forming a vertical channel via implantation, the vertical channel being at a distance from the first source, such that the vertical channel abuts the first top gate, the first horizontal channel, the first lower gate, and the drift region.

2. The method of claim 1, further comprising:
   f. forming the vertical channel via angled implantation with the first patterned hard masking layer in place.

3. The method of claim 1, further comprising:
   f. with the first mask in place, applying the three implants to a second unmasked portion of the top of the wafer to form a second lower gate, a second horizontal channel, and a second top gate in an upper portion of the drift region,
   g. wherein, the vertical channel further abuts the second top gate, the second horizontal channel, and the second lower gate;
   h. forming a second source in a portion of the second top gate, the second source being at a distance from the second source; and
   i. connecting the second top gate and the second lower gate to the first top gate and the first lower gate.

4. The method of claim 3, further comprising:
   j. forming the vertical channel via angled implantation with the first patterned hard masking layer in place.

5. The method of claim 3, further comprising:
   j. forming a lightly doped regions surrounding the first source and the second source via implantation, where the lightly doped regions are doped at ten percent or less of the level of doping of the first source and the second source.

6. The method of claim 1, further comprising:
   e. forming a lightly doped region surrounding the first source via implantation, where the lightly doped region is doped at ten percent or less of the level of doping of the first source.

7. A method for creating a junction field-effect transistor (JFET), comprising:
   a. applying a first mask to a wafer to form a first patterned hard masking layer to the top of the wafer, the wafer comprising an upper drift region and a bottom drain region;
   b. applying three implants to an unmasked portion of the top of the wafer to form a lower gate region, a horizontal channel region, and a top gate region in an upper portion of the drift region;
   c. forming a source region in a portion of the top gate region;
   d. connecting the top and lower gate regions;
   e. forming a vertical channel region via implantation, the vertical channel region being at a distance from the source region, the vertical channel region being adjacent to, and extending through, the top gate region, the horizontal channel region, and the lower gate region, to connect to the drift region; and
   f. forming a lightly doped region surrounding the source region via implantation, where the lightly doped region is doped at ten percent or less of the level of doping of the source region.

8. A method for creating a junction field-effect transistor (JFET), comprising:
   a. applying a first mask to a wafer to form a first patterned hard masking layer to the top of the wafer, the wafer comprising an upper drift region and a bottom drain region;
   b. applying three implants to an unmasked portion of the top of the wafer to form a lower gate region, a horizontal channel region, and a top gate region in an upper portion of the drift region;
   c. forming a source region in a portion of the top gate region;
   d. connecting the top and lower gate regions; and
   e. forming two vertical channels via implantation, one at each end of a region comprising the upper gate, the lower gate, and the horizontal channel,
   f. wherein the vertical channels are at a distance from the source, and wherein the vertical channels abut the top gate, the horizontal channel, and the lower gate, and the drift region.

* * * * *